(12) United States Patent
Li (10) Patent No.: US 11,024,627 B2
(45) Date of Patent: Jun. 1, 2021

(54) HIGH-K METAL GATE TRANSISTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 299 days.

(21) Appl. No.: 15/337,894

(22) Filed: Oct. 28, 2016

(65) Prior Publication Data
US 2017/0162575 A1    Jun. 8, 2017

(30) Foreign Application Priority Data
Dec. 7, 2015 (CN) .......................... 201510894275.9

(51) Int. Cl.
*H01L 21/28* (2006.01)
*H01L 27/092* (2006.01)
(Continued)

(52) U.S. Cl.
CPC .... *H01L 27/0924* (2013.01); *H01L 21/28088* (2013.01); *H01L 21/31051* (2013.01);
(Continued)

(58) Field of Classification Search
CPC ............. H01L 29/785; H01L 29/66795; H01L 29/7851; H01L 29/16; H01L 27/0924;
(Continued)

(56) References Cited

U.S. PATENT DOCUMENTS

2006/0017098 A1 *   1/2006   Doczy ............... H01L 21/28194
                                                         257/330
2011/0189847 A1 *   8/2011   Tsai .......................... G03F 7/20
                                                         438/595
(Continued)

FOREIGN PATENT DOCUMENTS

CN           103715091 A      4/2014

OTHER PUBLICATIONS

European Patent Office (EPO) The Extended European Search Report for 16199544.4 dated Jun. 29, 2017 14 Pages.

*Primary Examiner* — Jesse Y Miyoshi
(74) *Attorney, Agent, or Firm* — Anova Law Group, PLLC (57) ABSTRACT

The present disclosure provides HKMG transistor structures and fabrication methods thereof. An exemplary method includes providing a base substrate having a first region and a second region; forming a dielectric layer having a first opening in the first region and a second opening in the second region over; forming a gate dielectric layer on a side surface of the first opening and a portion of the base substrate in the first opening and on a side surface of the second opening and a portion of the base substrate in the second opening; filling a sacrificial layer in the first opening; forming a second work function layer in the second opening and a second gate electrode layer on the second work function layer; removing the sacrificial layer; and forming a first work function layer in the first opening and a first gate electrode layer on the first work function layer.

12 Claims, 6 Drawing Sheets

(51) Int. Cl.
*H01L 21/8238* (2006.01)
*H01L 29/51* (2006.01)
*H01L 29/78* (2006.01)
*H01L 29/66* (2006.01)
*H01L 21/3105* (2006.01)
*H01L 21/321* (2006.01)
*H01L 21/324* (2006.01)
*H01L 29/06* (2006.01)
*H01L 29/49* (2006.01)

(52) U.S. Cl.
CPC ...... *H01L 21/324* (2013.01); *H01L 21/32115* (2013.01); *H01L 21/823828* (2013.01); *H01L 21/823842* (2013.01); *H01L 21/823878* (2013.01); *H01L 27/092* (2013.01); *H01L 29/0649* (2013.01); *H01L 29/4966* (2013.01); *H01L 29/517* (2013.01); *H01L 29/66545* (2013.01); *H01L 29/66795* (2013.01); *H01L 29/785* (2013.01); *H01L 21/28185* (2013.01); *H01L 21/823821* (2013.01)

(58) Field of Classification Search
CPC ............. H01L 29/1079; H01L 29/7835; H01L 29/0653; H01L 21/823842; H01L 29/66545; H01L 29/4966
See application file for complete search history.

(56) References Cited

U.S. PATENT DOCUMENTS

| | | | |
|---|---|---|---|
| 2012/0088358 A1 | 4/2012 | Lee | |
| 2012/0223397 A1* | 9/2012 | Yang | H01L 21/28088 257/411 |
| 2013/0026579 A1* | 1/2013 | Lu | H01L 27/0922 257/369 |
| 2013/0056836 A1* | 3/2013 | Yu | H01L 21/76846 257/410 |
| 2013/0075826 A1 | 3/2013 | Xu | |
| 2013/0099320 A1* | 4/2013 | Lee | H01L 29/4966 257/368 |
| 2014/0319623 A1* | 10/2014 | Tsai | H01L 21/82346 257/401 |
| 2015/0024585 A1* | 1/2015 | Luo | H01L 21/28176 438/591 |
| 2015/0206974 A1 | 7/2015 | Lim et al. | |
| 2015/0236131 A1 | 8/2015 | Chang et al. | |
| 2015/0270177 A1* | 9/2015 | Tseng | H01L 21/0214 438/216 |
| 2015/0311341 A1* | 10/2015 | Hur | H01L 29/7849 257/190 |
| 2015/0380519 A1* | 12/2015 | Zhao | H01L 21/02318 257/410 |

* cited by examiner

HIGH-K METAL GATE TRANSISTOR STRUCTURE AND FABRICATION METHOD THEREOF

CROSS-REFERENCES TO RELATED APPLICATIONS

This application claims the priority of Chinese patent application No. 201510894275.9, filed on Dec. 7, 2015, the entirety of which is incorporated herein by reference.

FIELD OF THE INVENTION

The present invention generally relates to the field a semiconductor manufacturing technology and, more particularly, relates to high-K metal gate transistors and fabrication processes thereof.

BACKGROUND

Complementary metal-oxide-semiconductor (CMOS) devices are one of the basic types of semiconductor devices for forming integrated circuits (ICs). The CMOS devices include P-type CMOS (PMOS) devices and N-type CMOS (NMOS) devices.

In the existing techniques, to reduce the size of the gate and inhibit the short-channel effect, transistors with high dielectric constant (high-K) dielectric layers and metal gate layers (HKMG, high-K metal gate) have been developed. That is, the high-K dielectric layer is used to substitute the conventional silicon oxide dielectric layer in a transistor and to be used as a gate dielectric layer; and a metal material layer is used to substitute the conventional polysilicon gate layer in the transistor and to be used as a gate electrode layer. Thus, a HKMG structure is used as the gate structure of the transistor. Further, to adjust the work functions of the PMOS transistor and the NMOS transistor, work function layers are formed on the surface of the gate dielectric layer. The work function layer of the PMOS transistor needs to have a relatively high work function; and the work function layer of the NMOS transistor needs to have a relatively low work function. Thus, in the PMOS transistor and the NMOS transistor, the work function layers may be made of different materials to match the requirements for adjusting the individual work functions.

CMOS transistors may be formed by a gate-last process. The existing gate-last process includes forming a dummy gate layer on a PMOS region and an NMOS region of the surface of a semiconductor substrate; forming source regions and drain regions at two sides of the dummy gate layer; forming a dielectric layer exposing the dummy gate layers over the semiconductor substrate; removing the dummy gate layer to form openings in the dielectric layer; and sequentially forming the gate dielectric layers, work function layers and gate electrode layers in the openings. The gate electrode layers are made of metal materials. The gate dielectric layers are made of high-K materials. The work function layer in the region and the work function layer in the NMOS region are made of different materials.

However, the work function material for the PMOS transistor and the work function material for the NMOS transistor are different. Such a difference adversely affects the performance of the CMOS transistors.

The disclosed transistors and fabrication methods are directed to solve one or more problems set forth above and other problems in the art.

BRIEF SUMMARY OF THE DISCLOSURE

One aspect of the present disclosure includes a method for fabricating a high-K metal gate transistor structure. The method includes providing a base substrate having a first region and a second region; forming a dielectric layer having a first opening exposing a first surface portion of the base substrate in the first region and a second opening exposing a second surface portion of the base substrate in the second region over the base substrate; forming a gate dielectric layer on a side surface of the first opening and the first surface portion of the base substrate in the first opening and on a side surface of the second opening and the second surface portion of the base substrate in the second opening; filling a sacrificial layer in the first opening; forming a second work function layer in the second opening and a second gate electrode layer on the second work function layer; removing the sacrificial layer; and forming a first work function layer in the first opening and a first gate electrode layer on the first work function layer.

Another aspect of the present disclosure includes a high-K metal gate transistor structure. The high-K metal gate structure includes a semiconductor substrate having a first region and a second region; a plurality of fins formed on the semiconductor substrate in the first region and the second region; a first HKMG structure formed over the fins in the first region; a second HKMG structure formed over the fins in the second region; source/drain regions formed in the fins at the two sides of the HKMG structures; an isolation layer formed between adjacent fins; and a dielectric layer covering the side surfaces of the HKMG structures formed on the semiconductor substrate, the source/drain regions and the isolation layer. The first HKMG structure includes a gate dielectric layer, a first work function layer, and a first gate electrode layer; and the second HKMG structure includes a gate dielectric layer, a second work function layer, and a second gate electrode layer. The first HKMG structure and the second HKMG structure are formed by forming a first opening exposing a portion of a surface of the semiconductor substrate and the fins in the first region and a second opening exposing a portion of the surface of the semiconductor substrate and the fins in the second region; forming a gate dielectric layer on a side surface of the first opening and the exposed surfaces of the semiconductor substrate and the fins in the first opening and on a side surface of the second opening and the exposed surfaces of the semiconductor substrate and the fins in the second opening; filling a sacrificial layer in the first opening; forming the second work function layer in the second opening and the second gate electrode layer on the second work function layer; removing the sacrificial layer; and forming the first work function layer in the first opening and the first gate electrode layer on the first work function layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
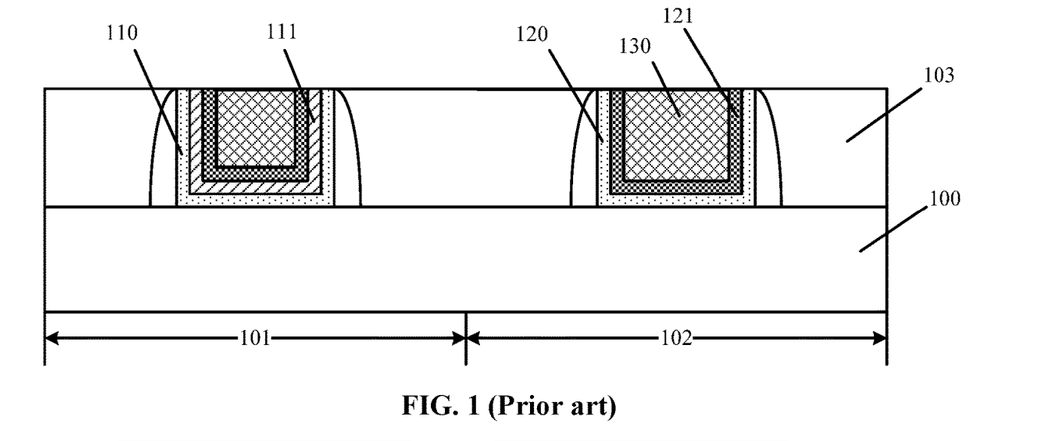
FIG. 1 illustrates a cross-sectional view of an existing CMOS transistor structure.
Figure 2:
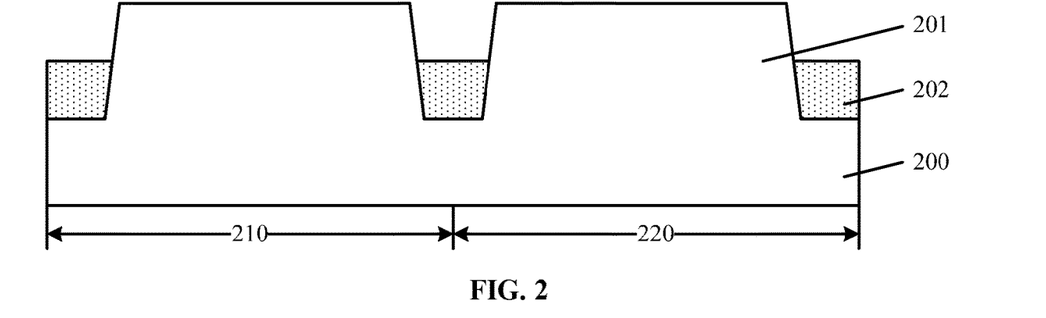
FIGS. 2-10 illustrate semiconductor structures corresponding to certain stages of an exemplary fabrication process of a high-K metal gate transistor structure consistent with the disclosed embodiments.

PMOS transistor and NMOS transistor often need different work function materials, and the difference of the work function materials affects the performance stability of the CMOS transistor structure. FIG. 1 illustrates the cross-sectional view of an existing CMOS transistor structure.

As shown in FIG. 1 the CMOS transistor structure includes a substrate 100 having a PMOS region 101 and an NMOS region 102. A dielectric layer 103 is formed on the surface of the substrate 100. The portion of the dielectric layer 103 in the PMOS region 101 may have a first opening (not labeled) exposing the surface of the substrate 100 and the portion of the dielectric layer 103 in the PMOS region may have a second opening (not labeled) exposing the surface of the substrate 100. A first gate dielectric layer 110 is formed on the side surface and the bottom surface of the first opening; and a second gate dielectric layer 120 is formed on the side surface and the bottom surface of the second opening.

Further, a first work function layer 111 is formed on the surface of the first gate dielectric layer 110 in the PMOS region 101; and a second work function layer 121 is formed on the surface of the second gate dielectric layer 120 and the surface of the first work function layer 111. A gate dielectric layer 130 may be formed on the surface of the first work function layer 111 and the surface of the second work function layer 121. The gate electrode layer 130 may fill the first opening and the second opening.

The first work function layer 111 is a P-type work function layer; and the second work function layer 121 is an N-type work function layer. Because the material of the N-type work function layer contains Al ions. To prevent the Al ions in the N-type work function layer from diffusing into the first gate dielectric layer 110 and the substrate 100, in the structure illustrated in FIG. 1, after forming the first work function layer 111 in the PMOS region 101, the N-type second work function layer 121 is formed in the NMOS region 102 and the PMOS region 101.

In the PMOS region 101, before forming the gate electrode layer 130, the stacked structure having the first dielectric layer 110, the first work function layer 111 and the second work function layer 121 is formed the first opening. Thus, the width of the remaining first opening along the direction parallel to the surface of the substrate 100 is relatively small; and the depth of the remaining first opening is relatively large. Therefore, the difficulty for filling gate electrode layer 130 in the first opening is increased; and the yield of the gate electrode layer 130 may be unacceptable. Further, voids are easy to form inside the gate electrode layer 130; and the interface bonding between the gate electrode layer 130 and the second work function layer 121 may be undesired.

In the NMOS region 102, before forming the gate electrode layer 130 and the second work function layer 121, the first work function layer 111 in the second opening needs to be removed to prevent the P-type work function layer from deteriorating the performance of the NMOS transistor. However, with the continuous shrinking of the critical dimension of the transistors, the size of the second opening along the direction parallel to the surface of the substrate 100 is correspondingly decreased. Thus, the depth-to-width ratio of the second opening is relatively large; and the difficulty for removing the first work function layer 111 in the second opening is relatively large. After removing the first work function layer 111 in the second opening, residual contaminations are easy to adhere on the inner surfaces of the second opening; and the surface of the second dielectric layer 102 in the second opening is also easily damaged. Accordingly, a mismatch between the PMOS transistor and the NMOS transistor is easily generated. Especially when the PMOS transistor and the NMOS transistor are used to form a SRAM device, the mismatch between the PMOS transistor and the NMOS transistor deteriorates the performance of the SRAM device, and the yield is reduced.

Figure 9:
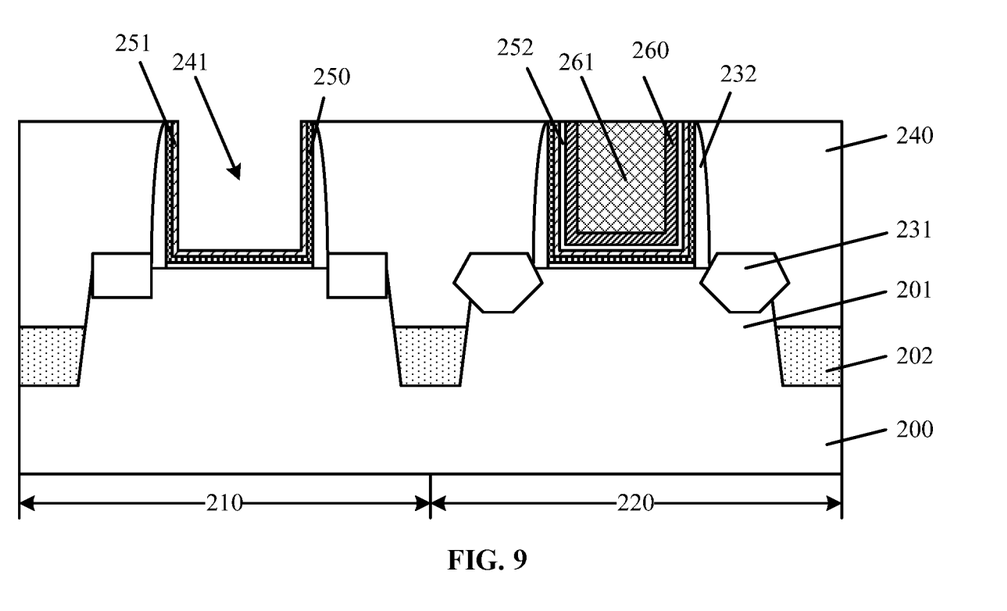
Figure 10:
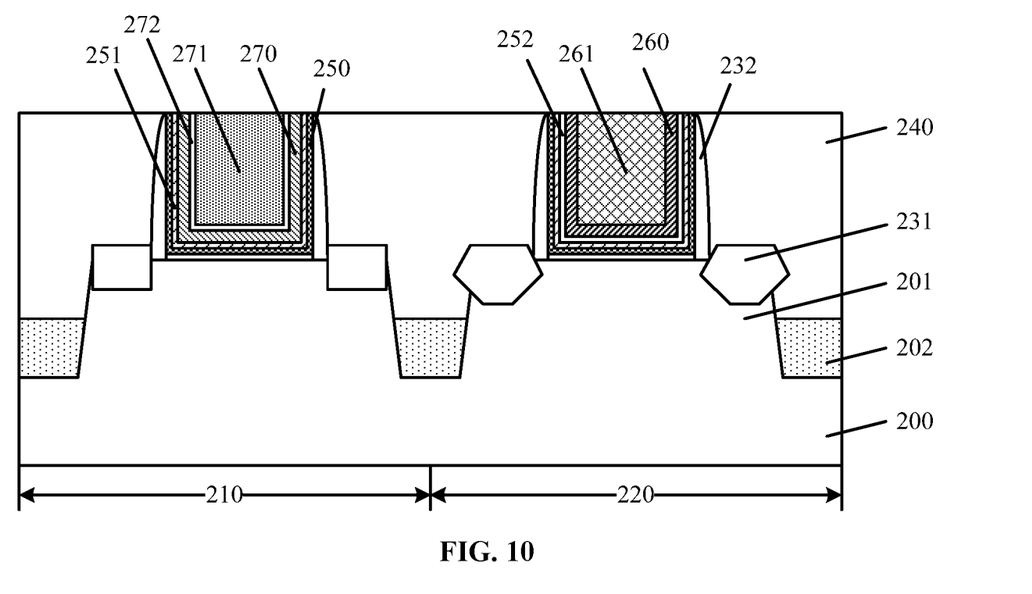
Figure 11:
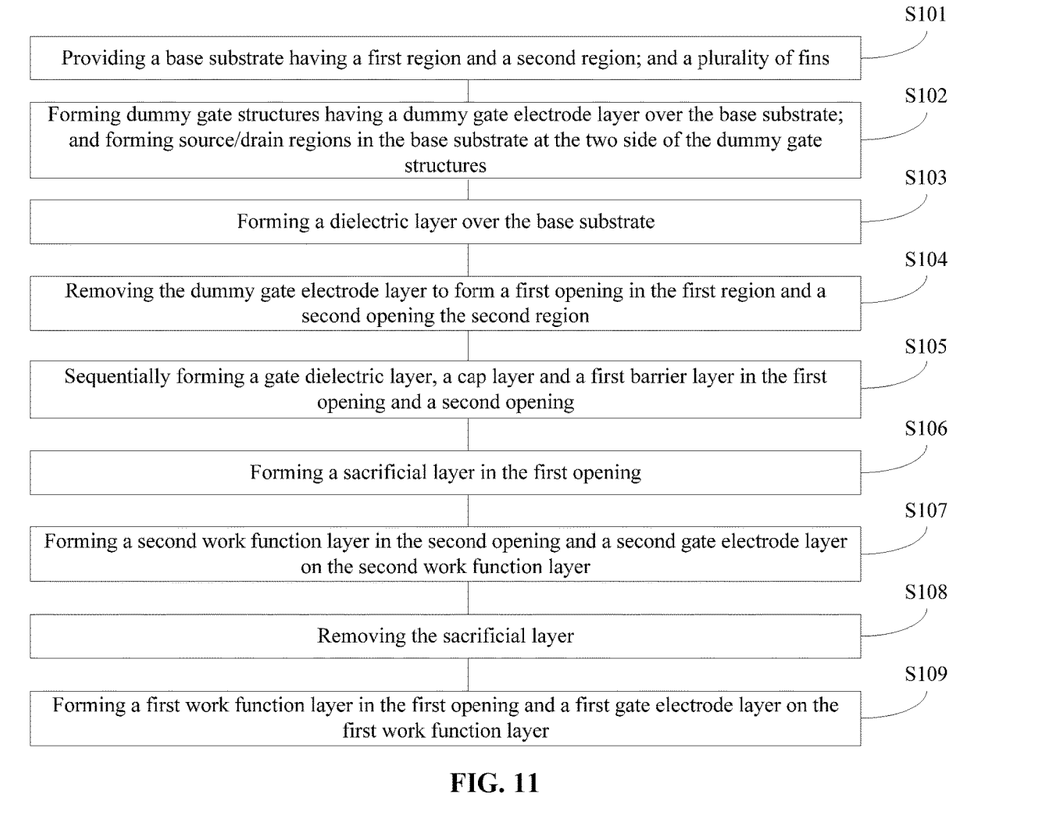
FIG. 11 illustrates an exemplary fabrication process of a high-K metal gate transistor structure consistent with the disclosed embodiments.

The present disclosure provides a high-K metal gate transistor structure and a fabrication method of the high-K metal gate transistor structure. FIG. 11 illustrates an exemplary fabrication process of a high-K metal gate transistor structure consistent with the disclosed embodiments; and FIGS. 2-10 illustrate structures corresponding to certain stages of the exemplary fabrication process.

As shown in FIG. 11, at the beginning of the fabrication process, a substrate with certain structures is provided (S101). FIG. 1 illustrates a corresponding semiconductor structure.

As shown in FIG. 1, a base substrate is provided. The base substrate may have a first region 210 and a second region 220.

In one embodiment, the first region 210 is an NMOS region; and may be used to form an NMOS transistor. The second region 220 is a PMOS region; and may be used to form a PMOS transistor.

In some embodiments, transistors formed in the first region 210 and the second region 220 are used to form a CMOS transistor structure. In other embodiments, the transistors formed in the first region 210 and the second region 220 may be used to form a static random accessible memory (SRAM) device. In this case, the NMOS transistor formed in the first region 210 may be configured as a pull-down (PD) transistor; and the PMOS transistor formed in the second region 220 may be configured as a pull-up (PU) transistor, or a pass-gate (PG) transistor.

In one embodiment, the transistor formed in the first region 210 and the transistor formed in the second region 220 are fin field-effect transistors (FinFETs). Thus, the base substrate in FIG. 1 may include a semiconductor substrate 200; and a plurality of fins 201 formed on the surface of the semiconductor substrate 200 in the first region 210 and the second region 220, respectively. The base substrate may also include an isolation layer 202 formed on the surface of the semiconductor substrate 200. The isolation layer 202 may cover the side surfaces of the fins 201; and the top surface of the isolation layer 202 may be lower than the top surfaces of the fins 201.

Further, a first well region (not shown) may be formed in the fins 201 in the first region 210 and a portion of the semiconductor substrate 200. The first well region may be doped with P-type ions. A second well region (not shown) may be formed in the fins 201 in the second region 220 and a portion of the semiconductor substrate 200. The second well region may be doped with N-type ions.

In one embodiment, the process for forming the semiconductor substrate 200 and the plurality of fins 201 may include: providing an initial substrate, forming a mask layer covering portions of the surface of the initial substrate corresponding to the plurality of the fins 201 on the surface of the initial substrate; and etching the initial substrate using the mask layer as an etching mask to form the plurality of fins 201 and the semiconductor substrate 200 under the plurality of fins 201. The first well region and the second well region may be formed before forming the fins 201, or after forming the fins 201.

The mask layer may be formed by forming a mask material layer on the surface of the initial substrate, forming a patterned layer on the mask material layer; and etching the mask material layer using the patterned layer as an etching mask until the surface of the initial substrate is exposed. Thus, the mask layer may be formed.

In one embodiment, the patterned layer may be a patterned photoresist layer. The patterned photoresist layer may be formed by a spin-coating process and a photolithography process, etc.

In certain embodiments, a multiple-mask patterning process may form the patterned layer. The multiple-mask patterning process may include a self-aligned double patterning (SaDP) process, a self-aligned triple patterning process; or a self-aligned double double patterning (SaDDP) process, etc.

The initial substrate may be made of any appropriate semiconductor material, such as silicon, silicon germanium, or Group III-V compounds, etc. The initial substrate may be etched by any appropriate process. In one embodiment, an anisotropic dry etching process is used to etch the initial substrate to form the plurality of fins 201 and the semiconductor substrate 200.

The side surfaces of the fins 201 may be perpendicular to the surface of the semiconductor substrate 200, or may be inclined and have an angle with the surface of the semiconductor substrate 200. In one embodiment, the side surfaces of the fins 201 are inclined with the surface of the semiconductor substrate 200. When the side surfaces of the fins 201 are inclined with the surface of the semiconductor substrate 200, the bottom width of the fins 201 may be greater than the top width of the fins 201.

In certain embodiments, the fins may be formed by etching a semiconductor layer formed on the surface of the semiconductor substrate. The semiconductor layer may be formed on the surface of the semiconductor substrate by an epitaxial growth process. The semiconductor substrate may be a silicon substrate, a silicon germanium substrate, a silicon carbide substrate, a silicon on insulator (SOI) substrate, a germanium on insulator (GOI) substrate, a glass substrate, or a Group III-V compound substrate, such as a gallium nitride substrate or a gallium arsenide substrate, etc. The semiconductor layer may be made of silicon germanium, silicon carbide, or silicon germanium, etc.

In one embodiment, before forming the insolation layer 202, an interface layer may be formed on the surface of the semiconductor substrate 200 and the side and top surfaces of the fins 201; and the insolation layer 202 may be formed on the interface layer. The interface layer may be made of silicon oxide; and may be formed by an oxidation process. The thickness of the interface layer may be in a range of approximately 5 nm-50 nm. The oxidation process may include an in-situ steam generation (ISSG) process, a decoupled plasma oxidation (DPO) process, a radical oxidation process, or a wet oxidation process, etc.

The process for forming the insulation layer 202 may include forming an isolation film on the surface of the semiconductor substrate 200 and the side and top surfaces of the fins 201; planarizing the isolation film until the top surfaces of the fins 201 are exposed; and performing an etch-back process to the remaining isolation film until the side surfaces of the fins 201 are exposed with a predetermined size. Thus, the insulation layer 202 may be formed on the bottom portions of the side surfaces of the fins 201.

The isolation layer 202 may be made of any appropriate material. In one embodiment, the isolation layer 202 is made of silicon oxide.

Various processes may be used to form the isolation film, such as a flowable chemical vapor deposition (FCVD) process, a plasma-enhanced chemical vapor deposition (PECVD) process, a high aspect ratio chemical vapor deposition (HARP CVD) process, or a physical vapor deposition (PVD) process, etc.

The planarization process may be a chemical mechanical polishing (CMP) process, etc. The etch-back process may be an isotropic dry etching process, an anisotropic dry etching process, or a wet etching process, etc.

In certain embodiments, the transistors formed in the first region and the second region may be planar transistors. The base substrate may be a planar substrate; and shallow trench isolation (STI) structures may be formed in the base substrate between the first region and the second region.

The base substrate may include silicon substrate, silicon germanium substrate, silicon carbide substrate, SOI substrate, GOI substrate, glass substrate, or Group III-V compound substrate (such a gallium nitride or gallium arsenide, etc.), etc. A first well region may be formed in the first region; and the first well region may be doped with P-type ions. A second well region may be formed in the second region; and the second region may be doped with N-type ions.

A dielectric layer may be subsequently formed on the surface of the base substrate. The dielectric layer may have a first opening and a second opening. The first opening may expose a first surface portion of the base substrate in the first region; and the second opening may expose a second surface portion of the base substrate in the second region.

Figure 3:
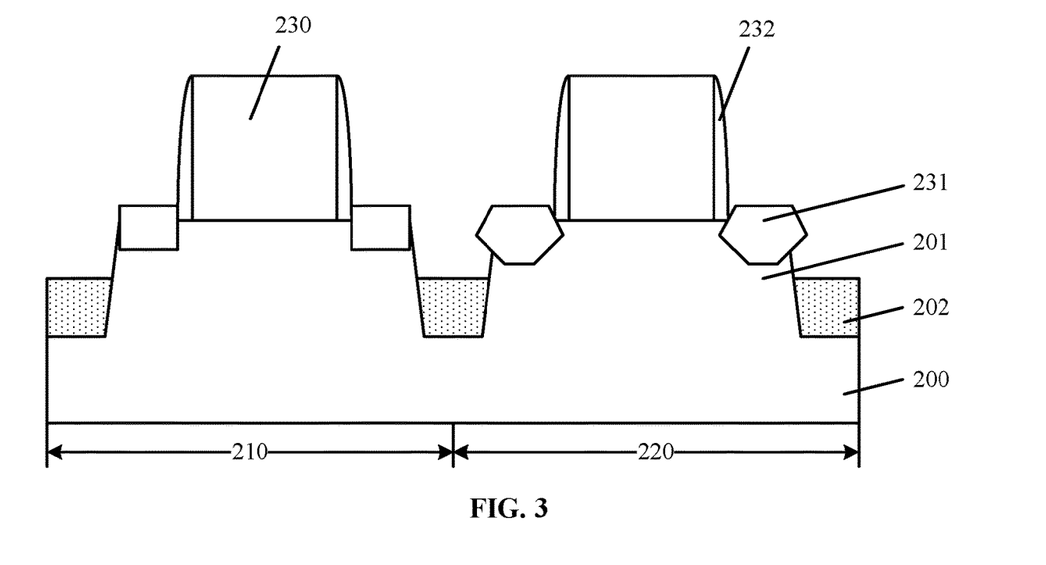

Returning to FIG. 11, after forming the isolation layer 202, dummy gate structures may be formed on the surface of the base substrate (S102). FIG. 3 illustrates a corresponding semiconductor structure.

As shown in FIG. 3, dummy gate structures (not labeled) are formed on the surface of the base substrate. The dummy gate structures may include a dummy gate electrode layer 230.

In one embodiment, the subsequently formed NMOS transistor in the first region 210 and the subsequently formed PMOS transistor in the second region 220 are high-K metal gate (HKMG) transistors. That is, a high dielectric constant (high-K) dielectric material may be used as the gate dielectric layer; and a metal material may be used as the gate electrode layer. The PMOS transistor and the NMOS transistor may be formed by a gate-last process. Thus, the dummy gate electrode layer 230 in the first region 210 may be subsequently substituted to form a first gate dielectric layer and a first gate electrode layer. The dummy gate electrode layer 230 in the second region 220 may be subsequently substituted to form a second gate dielectric layer and a second gate electrode layer.

In one embodiment, a plurality of dummy gate structures may cross over the plurality of fins 201 in the first region 210 and the second region 220. The dummy gate structures may cover the top surfaces and portions of the side surfaces of the fins 201 and a portion of the surface of the isolation layer 202.

The dummy gate electrode layer 230 may be made of any appropriate material. In one embodiment, the dummy gate electrode layer 230 is made of poly silicon.

The process for forming the dummy gate electrode layer 230 may include forming a dummy gate film on the surfaces of the isolation layer 202 and the fins 201; forming a patterned layer on portions of the surface of the dummy gate film; etching the dummy gate film until the top surfaces and portions of the side surfaces of the fins 201 and the surface of the isolation layer 202 are exposed using the pattered layer as an etching mask. Thus, the dummy gate electrode layer 230 may be formed.

In one embodiment, sidewall spacers 232 may be formed on the side surfaces of the dummy gate structure including the dummy gate electrode layer 230. The sidewall spacers 232 may be used to define the distance between the subsequently formed source/drain regions and the dummy gate electrode layer 230. The sidewall spacers 232 may be made of any appropriate material, such as one or more of silicon oxide, silicon nitride, and silicon oxynitride, etc.

In one embodiment, a dummy gate dielectric layer (not shown) may be formed between the base substrate and the dummy gate electrode layer 230. The dummy gate dielectric layer may be made of silicon oxide. Various processes may be used to form the dummy gate dielectric layer, such as an atomic layer deposition (ALD) process, a CVD process, a thermal oxidation process, a wet oxidation process, or an ISSG process, etc.

Further, source/drain regions 231 may be formed in the fins 201 at two sides of the dummy gate structures. The process for forming the source/drain regions 231 may include forming stress layers in the fins 201 at the two sides of the gate structures; and doping N-type ions or P-type ions in the stress layers to form the source/drain regions 231.

The process for forming the stress layers may include forming third opening in the fins 201 at the two sides of the gate structures; and forming the stress layers in the third openings by filling the third openings using an epitaxial growth process. The surfaces of the stress layers may be higher than or level with the top surfaces of the fins 201.

The stress layer in the first region 210 may be made of silicon carbide. The stress layer in the second region 220 may be made of silicon germanium. The sidewalk of the stress layer in the first region 210 may be perpendicular to the top surfaces of the fins 201. The sidewalls of the stress layer in the second region 220 and the top surfaces of the fins 201 may present an "Σ" shape; and the side surfaces of the stress layer may have protruding angles. The apex of the protruding angle may extend into the fin 201 under the dummy gate layer 230. The stress layers may be doped with N-type ions or P-type ions by an in-situ doping process, an ion implantation process, or a combination thereof.

In certain embodiments, the source/drain regions may be formed in the fins 201 at the two sides of the dummy gate structures by an ion implantation process. In certain other embodiments, if the base substrate is a planar substrate, the source/drain regions may be formed in the base substrate at the two sides of the dummy gate structures.

Figure 4:
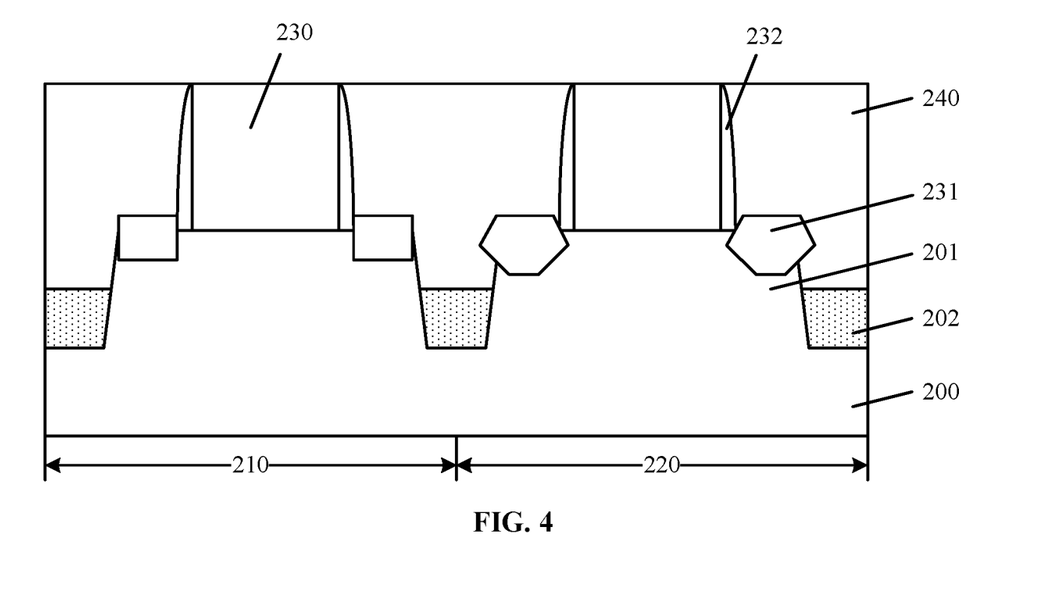

Returning to FIG. 11 after forming the source/drain regions 231, a dielectric layer may be formed (S103). FIG. 4 illustrates a corresponding semiconductor structure.

As shown in FIG. 4, a dielectric layer 240 is formed over the surface of the base substrate. The top surface of the dielectric layer 240 may level with the top surfaces of the dummy gate structures. The dielectric layer 240 may be on the surface of the base substrate, the surfaces of the source/drain regions 231, the surface of the isolation layer 202 and the side surfaces of the sidewalls 232.

The dielectric layer 240 may be used to electrically isolate the adjacent dummy gate structures. The dielectric layer 240 may also be used to keep the structures and positions of the dummy gate layer 230. The dielectric layer 240 may be made of any appropriate material, such as silicon oxide, silicon nitride, silicon oxynitride, low-K dielectric material (the dielectric constant is greater than or equal to approximately 2.5 and smaller than approximately 3.9), or ultra-low-K dielectric material (the dielectric constant is smaller than approximately 3.9), etc.

The process for forming the dielectric layer 240 may include forming a dielectric film on the surfaces of the base substrate and the dummy gate structures; and planarizing the dielectric film until the top surfaces of the dummy gate structures are exposed. Thus, the dielectric layer 240 may be formed.

In one embodiment, before forming the dielectric film, an etching stop layer may be formed on the surfaces of the base substrate and the dummy gate structures. The etching stop layer may be used as a stop layer for subsequently forming contact through holes. The etching stop layer may be made of a material different from that of the dielectric layer 240.

Various processes may be used to form the dielectric film, such as a CVD process, a PVD process, or an ALD process, etc. In one embodiment, the dielectric film is formed by an FCVD process. The planarization process may be a CMP process.

Figure 5:
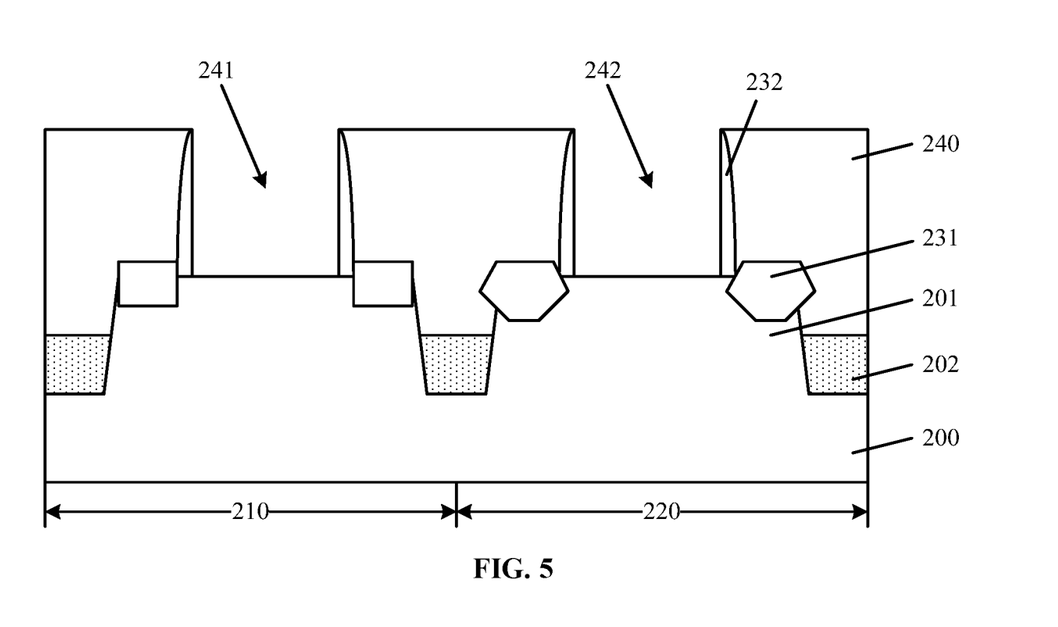

Returning to FIG. 11, after forming the dielectric layer 240, the dummy gate electrode layers 230 may be removed (S104). FIG. 5 illustrates a corresponding semiconductor structure.

As shown in FIG. 5, the dummy gate electrode layers 230 are removed. A first opening 241 may be formed in the dielectric layer 240 in the first region 210. A second opening 242 may be formed in the dielectric layer 240 in the second region 220.

The first opening 241 may cross over the fins 201 in the first region 210; and may expose the side and top surfaces of portions of the fins 201 in the first region 210. The second opening 242 may cross over the fins 201 in the second region 220; and may expose the side and top surfaces of the fins 201 in the second region 220.

The dummy gate layers 230 may be removed by any appropriate process, such as a dry etching process, or a wet etching process, etc. The dry etching process may be an isotropic etching process, or an anisotropic dry etching process. The wet etching process may be an isotropic wet etching process.

In one embodiment, the dummy gate layer 230 is made of polysilicon. The etching gas of the dry etching process may include one or more of $Cl_2$ and $Br_2$, etc. The etching solution of the wet etching process may include one or more of a nitric acid solution and a hydrogen fluoride solution, etc.

In one embodiment, a wet etching process is used to remove the dummy gate layer 230. The wet etching process may have relatively fewer damages to the surfaces of the fins 201.

In one embodiment, a dummy gate dielectric layer may be formed between the dummy gate layer 203 and the fins 201. Thus, after removing the dummy gate layer 230, the dummy gate dielectric layer on the bottoms of the first opening 241 and the second opening 242 may be removed.

The dummy gate dielectric layer may be removed by a SiConi™ etching process. The SiConi™ etching process is an isotropic dry etching process; and may generate fewer damages to the top and side surfaces of the fins 201.

Figure 6:
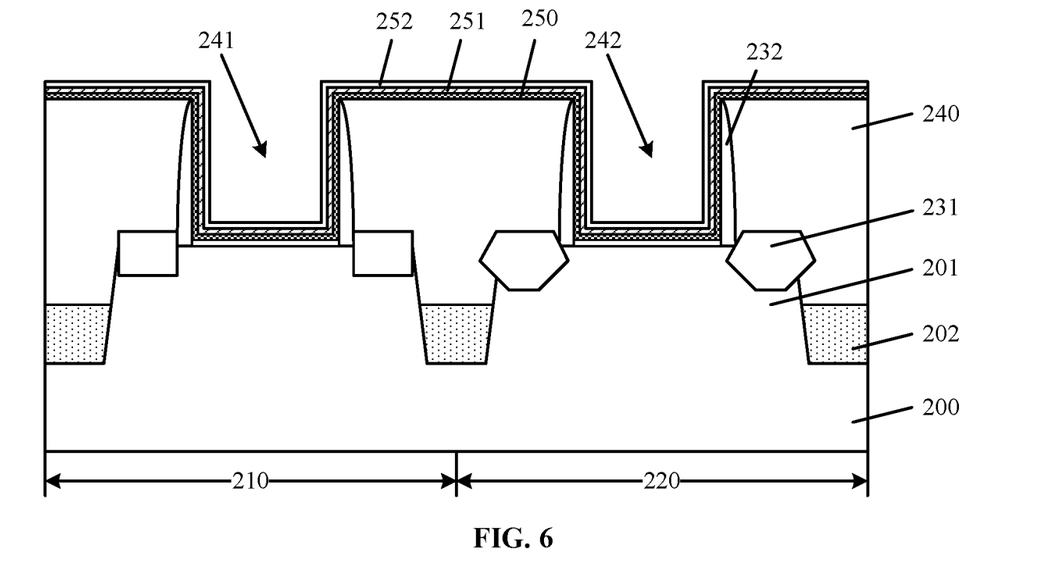

Returning to FIG. 11, after forming the first opening 241 and the second opening 242, a gate dielectric layer, a cap layer and a first barrier layer may be formed (S105). FIG. 6 illustrates a corresponding structure.

As shown in FIG. 6, a gate dielectric layer 250 is formed on the side and bottom surfaces of the first opening 241 and the second opening 242, and the surface of the base substrate. Further, a cap layer 251 may be formed on the gate dielectric layer 250; and a first barrier layer 252 may be formed on the cap layer 251. In one embodiment, the gate dielectric layer 250 may also be formed on the side and top surfaces of the fins 201 exposed by the first opening 241 and the second opening 242.

The gate dielectric layer 250 may be made of any appropriate material, such as a high-K dielectric material, etc. The high-K dielectric material may include HfO, ZrO, HfSiO, LaO, ZrSiO, TiO, TaO, BaSrTiO, BaTiO, SrTiO, or AlO, etc. Various processes may be used to form the gate dielectric layer 250, such as a CVD process, a PVD process, or an ALD process, etc. The thickness of the gate dielectric layer 250 may be in a range of approximately 10 Å-50 Å.

In one embodiment, before forming the dielectric layer 250, an interface layer (not shown) may be formed on the surface of the base substrate on the bottoms of the first opening 241 and the second opening 242. The gate dielectric layer 250 may be formed on the interface layer. The interface layer may be used to increase the bonding strength between the gate dielectric layer 250 and the base substrate; and may also be used to repair the interface defects at the interface between the gate dielectric layer 250 and the base substrate.

The interface layer may be made of silicon oxide. Various processes may be used to form the interface layer, such as an oxidation process, etc. The oxidation process may include a thermal oxidation process, or a wet oxidation process, etc.

The cap layer 251 may be used to protect the gate dielectric layer 250; and prevent the atoms in the subsequently formed first work function layer, the second work function layer, the first gate electrode layer and the second gate electrode layer from the diffusing into the gate dielectric layer 250. Thus, the cap layer 251 may be able to ensure the stability of the gate dielectric layer 250. Accordingly, the threshold voltage of the finally formed transistors may not be easy to have a drift.

The cap layer 251 may be made of any appropriate material. In one embodiment, the cap layer 251 is made of TiN. Various processes may be used to form the cap layer 251, such as a CVD process, a PVD process, or an ALD process. The thickness of the cap layer 251 may be in a range of approximately 5 Å-20 Å. In certain other embodiments, the cap layer may be omitted.

In one embodiment, after forming the cap layer 251 and before subsequently forming a sacrificial layer, a thermal annealing process may be performed. The thermal annealing process may be used to activate the doping ions in the source/drain regions 231. The cap layer 251 may be able to absorb the defects, contaminations, and oxygen vacancies, etc., caused by thermal annealing process; and prevent the defects, contaminations, and oxygen vacancies, etc., from diffusing into the gate dielectric layer 250.

The first barrier layer 252 may be used as a polishing stop layer for subsequently forming a second work function layer in the second region 220. The first barrier layer 252 may be made of a material different from that of the subsequently formed second work function layer to cause the first barrier layer 252 and the subsequently formed first work function layer to have an etching selectivity.

In one embodiment, the second region 220 may be used to form a PMOS transistor. Thus, the first barrier layer 251 may be made of a P-type work function material. The first barrier layer 251 in the second region 220 may be kept in the PMOS transistor; and may be used to adjust the threshold voltage of the transistor formed in the second region 220.

The first barrier layer 252 may be made of TaN. TaN is a P-type work function material. Various processes may be used to form the first barrier layer 252, such as a CVD process, a PVD process, or an ALD process, etc. The thickness of the first barrier layer 252 may be in a range of approximately 5 Å-20 Å. In certain other embodiments, the first barrier layer may be omitted.

Figure 7:
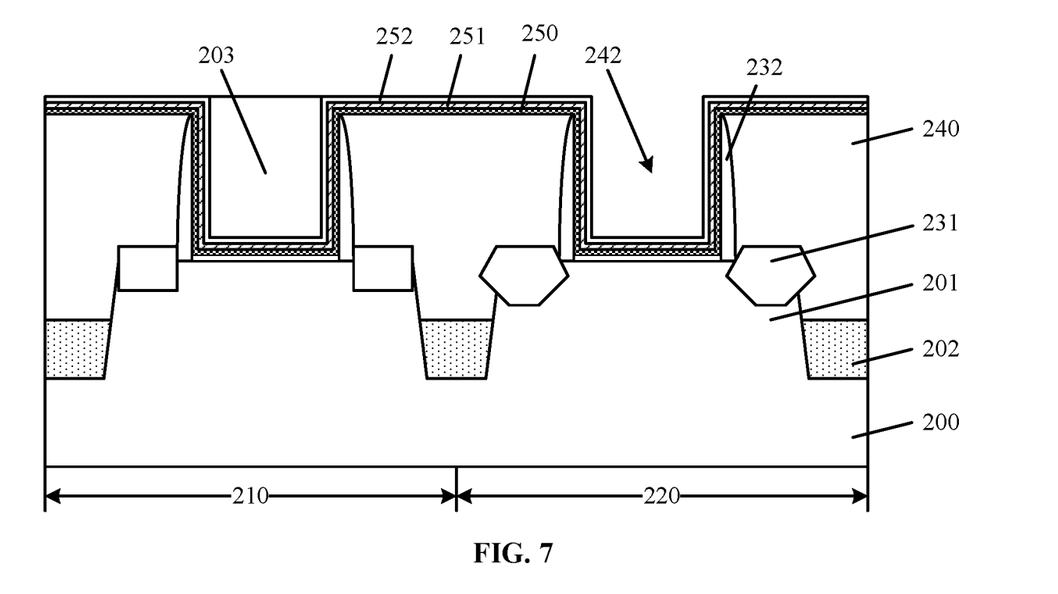

Returning to FIG. 11, after forming the gate dielectric layer 250, a sacrificial layer may be formed (S106). FIG. 7 illustrates a corresponding semiconductor structure.

As shown in FIG. 7, a sacrificial layer 203 is formed in the first opening 241. The sacrificial layer 203 is filled in the first opening 241. Thus, the subsequent processes may be able to form a second work function layer and a second gate electrode layer in the second opening 242.

Because the first opening 241 is filled with the sacrificial layer 203, the subsequently formed second work function layer may only be formed in the second opening 242, conventional step for removing the second work function layer in the first opening 241 may be omitted. Thus, the damages to the inner side surfaces of the first opening 241 caused by the process for etching the second work function layer may be avoided; and the finally formed NMOS transistor may be more stable. Further, the mismatch between the NMOS transistor and the PMOS transistor formed in the second region 220 may be avoided.

Further, because the sacrificial layer 203 is filled in the first opening 241, after subsequently forming the second work function layer and the second gate electrode layer in the second opening 242, subsequent processes may be performed in the first opening 241. Thus, after subsequently forming the second work function layer, it may not need to form the first work function layer in the first opening 241 and the second opening 242 simultaneously. Therefore, before forming the second gate electrode layer, the first work function layer may not be formed in the second opening 242. Accordingly, the depth-to-width ratio of the second opening 242 may be reduced. Reducing the depth-to-width ratio of the second opening 242 may aid to subsequently fill a second gate electrode layer into the second opening 242. Further, the second gate electrode layer may be dense; the bonding strength between the second gate electrode layer and the second work function layer may be as desired; and the bonding strength between the second work function layer and the first barrier layer 252 may be as desired.

The sacrificial layer 203 may be made of any appropriate material, such as a back anti-reflection coating (BARC) material, a deep UV light absorbing oxide (DUO) material, or an organic dielectric (ODL) material, etc. The sacrificial layer 203 may need to be removed subsequently. The BARC material and the ODL material may be easily filled in the first opening 241; and may be easily to remove; and may be not easy to leave residuals.

The process for forming the sacrificial layer 203 may include forming a sacrificial film over the surface of the dielectric layer 250 and to fill the first opening 241 and the second opening 242; planarizing the sacrificial film to remove the sacrificial film above the dielectric layer 240;

and removing the sacrificial film in the second opening 242. Thus, the sacrificial layer 203 may be formed in the first opening 241.

The sacrificial film may be formed by a coating process, such as a spin-coating process, or a spray coating process, etc., on the first barrier layer 252. The sacrificial film may also fill the first opening 241 and the second opening 242. The planarization process may be a CMP process. The surface of the first barrier layer 252 may be used as a stop layer of the CMP process.

The process for removing the sacrificial film in the second opening 242 may include forming a patterned layer covering the sacrificial film in the first opening 241; and removing the sacrificial film in the second opening 242 using the patterned layer as a mask. The sacrificial film in the second opening 242 may be removed by a dry etching process, a wet etching process, or a plasma ashing process, etc.

Figure 8:
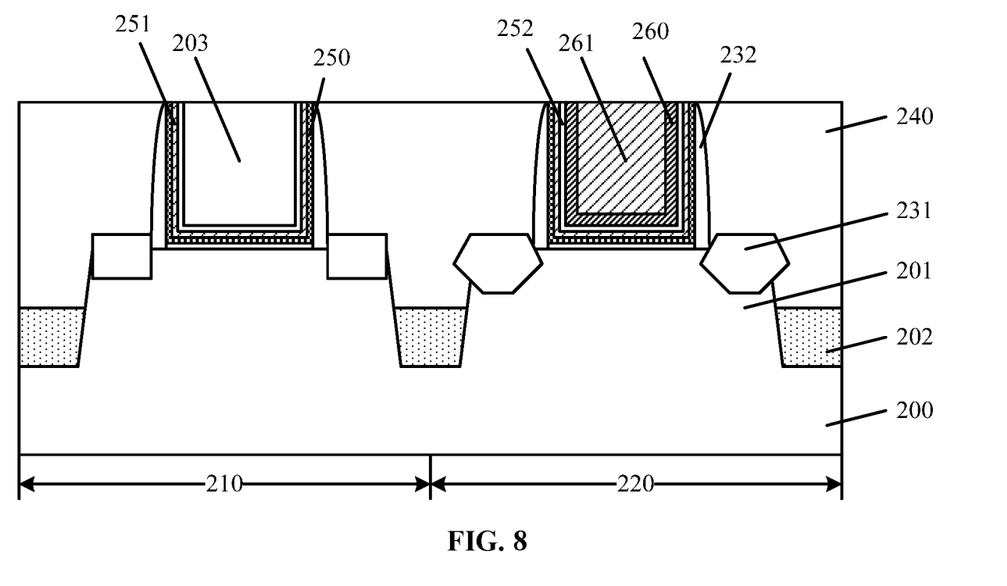

Returning to FIG. 11, after forming the sacrificial layer 203, a second work function layer and a second gate electrode layer may be formed (S107). FIG. 8 illustrates a corresponding semiconductor structure.

As shown in FIG. 8, a second work function layer 260 is formed in the second opening 242; and a second gate electrode layer 261 is formed on the second work function layer 260. The second gate electrode layer 261 may fill the second opening 242.

The second gate electrode layer 261, the second work function layer 260 and the gate dielectric layer 250 may be form a HKMG structure of the PMOS transistor in the second region 220; and may be referred to a second HKMG structure.

In some embodiments, the second work function layer 260 may be formed on the surface of the first barrier layer 252. In other embodiments, if the first barrier layer is optional and omitted, the second work function layer 260 may be formed on the cap layer 251 or may be directly formed on the surface of the gate dielectric layer 250.

The second work function layer 260 may be used to adjust the threshold voltage of the transistor formed in the second region 220. In one embodiment, the second region 220 may be used to form a PMOS transistor. Thus, the second work function layer 260 may be made of a P-type work function material. In one embodiment, the second work function layer 260 is made of TiN. TiN may have a relatively high work function; and may be able to adjust the threshold voltage of the PMOS transistor. The thickness of the second work function layer 260 may be in a range of approximately 20 Å-50 Å.

The process for forming the second work function layer 260 and the second gate electrode layer 261 may include forming a second work function film on the surface of the first barrier layer 252 and the surface of the sacrificial layer 203; forming a second gate electrode film on the second work function film to fill the second opening 242; planarizing the gate electrode film and the second work function film until the surface of the dielectric layer 240 is exposed. The surface of the sacrificial layer 203 may also be exposed. Thus, the second gate electrode layer 261 and the second work function layer 260 may be formed.

In certain embodiments, if the optional first barrier layer 252 and the cap layer 251 are omitted, the second work function film may be formed on the gate dielectric layer 250. Then, the second gate electrode film may be formed on the second work function film.

The second work function film may be formed by any appropriate process. In one embodiment, an ALD process is used to form the second work function film. The reaction gas of the ALD process may include a first precursor gas containing Ti. The Ti-containing first precursor gas may include one or more of $TiCl_4$, $Ti[N(C_2H_5CH_3)]_4$, $Ti[N(CH_3)_2]_4$, $Ti[N(C_2H_5)_2]_4$, etc. The reaction gas of the ALD process may also include a second precursor gas. The second precursor gas may include $NH_3$, CO, or $H_2O$, etc. A flow rate of the first precursor gas may be in a range of approximately 50 sccm-200 sccm. The flow rate of the second precursor gas may be in a range of approximately 50 sccm-200 sccm. The reaction temperature of the ALD process may be in a range of approximately 400° C.-600° C.

The second work function film formed by the ALD process may have a desired coverage; and may be able to tightly adhere to the sidewalls and the bottom surface of the second opening 242. Further, the thickness of the work function film formed by the ALD process may be uniform. The uniformity of the thickness of the second work function film may cause the formed second work function layer 260 to be able to stably adjust the threshold voltage of the PMOS transistor.

Because Al is an N-type work function material; and may deteriorate the performance of the PMOS transistor. Thus, the second gate electrode layer 261 may be made of a material not containing Al. In one embodiment, the second region 220 may be used to form a PMOS transistor; and the second gate electrode layer 261 is made of W. Various processes may be used to form the second gate electrode film, such as a PVD process, a CVD process, an electroplating process, or a chemical plating process, etc.

The planarization process of the second gate dielectric film and the second work function film may be a CMP process, or a mask-less anisotropic dry etching process. In one embodiment, a CMP process is used to planarize the second gate electrode film and the second work function film; and the first barrier layer 252 may be used as the polishing stop layer.

In one embodiment, after planarizing the second gate electrode film and the second work function film, the CMP process may be continued to planarize the first barrier layer 252, the cap layer 251 and the gate dielectric layer 250 until the top surface of the dielectric layer 240 is exposed.

Returning to FIG. 11, after forming the second gate electrode layer 261, the sacrificial layer 203 may be removed (S108). FIG. 9 illustrates a corresponding semiconductor structure.

As shown in FIG. 9, the sacrificial layer 203 in the first opening 241 is removed. The sacrificial layer 203 may be removed by any appropriate process, such as a dry etching process, a wet etching process, or a plasma ashing process, etc. The dry etching process may be an anisotropic dry etching process, or an isotropic dry etching process. In one embodiment, the sacrificial layer 203 is removed by a wet etching process.

After removing the sacrificial layer 203, the first opening 241 is exposed. The first opening 241 may be used to form the work function layer and the gate electrode layer of the NMOS transistor. In one embodiment, the sacrificial layer may be a bottom anti-reflection material, a deep UV absorption oxide material, or an organic dielectric material, etc. Thus, the sacrificial layer 203 may be easy to remove; and residual by-products may not easy to be formed on the inner side surfaces of the first opening 241 after removing the sacrificial layer 203. Further, the inner side surfaces may have fewer damages after removing the sacrificial layer 203. Thus, the performance of the NMOS transistor formed in the first region 210 may be stable. Further, the mismatch between the NMOS transistor and the PMOS transistor formed in the second region 220 may be avoided.

In one embodiment, after removing the sacrificial layer 203, the first barrier layer 252 in the first opening 241 may be removed. The first barrier layer 252 may be removed by an isotropic dry etching process, or a wet etching process, etc. After removing the first barrier layer 252 the size of the first opening 241 may be increased; and it may aid to subsequently form a first work function layer and a first gate electrode layer in the first opening 241.

Returning to FIG. 11, after removing the sacrificial layer 203 in the first opening 241, a first work function layer and a first gate electrode layer may be formed (S109). FIG. 10 illustrates a corresponding semiconductor structure.

As shown in FIG. 10, a first work function layer 270 is formed in the first opening 241. In one embodiment, the first work function layer 270 may be formed on the cap layer 251. Further, a first gate electrode layer 271 may be formed on the first work function layer 270. The first gate electrode layer 271 may fill the first opening 241.

The first gate electrode layer 271, the first work function layer 270 and the gate dielectric layer 250 may form a HKMG structure of an NMOS transistor in the first region 210; and may be referred to as a first HKMG structure.

The first work function layer 270 may be used to adjust the threshold voltage of the transistor formed in the first region 270. In one embodiment, the first region 210 may be used to form an NMOS transistor, the first work function layer 270 may be made of TiAlC. TiAlC may have a relatively low work function; and may be able to adjust the threshold voltage of the NMOS transistor. Further, the material of the first work function layer 270, i.e., TiAlC, may include C ions. C ions may be able to fill defects; and may form stable function groups with Ti ions and Al ions; and may be able to avoid the diffusion of the Al ions. Thus, the stability of the dielectric constant of the gate dielectric layer 250 may be ensured. The thickness of the first work function layer 270 may be in a range of approximately 20 Å-50 Å.

The process for forming the first work function layer 270 and the first gate electrode layer 271 may include forming a first work function film over the gate dielectric layer 250, the dielectric layer 240 and the second gate electrode layer 261; and forming a gate electrode film filling the first opening on the surface of the first work function film; and planarizing the first gate electrode film and the first work function film until the surface of the dielectric layer 240 is exposed. Thus, the first gate electrode layer 271 and the first work function layer 270 may be formed.

The first work function film may be formed by any appropriate process. In one embodiment, the first work function film is formed by an ALD process. The first work function film formed by the ALD process may have a desired coverage ability; and may be able to have a tight adhesion with the side and bottom surfaces of the first opening 241. Further, the thickness of the first work function film formed by the ALD process may be uniform; and such a uniform thickness of the first work function film may cause threshold voltage adjustment of the formed first work layer 270 to the NMOS transistor to be stable and easy to control.

The first gate electrode layer 271 may be made of TiAl or W. Various processes may be used to form the first gate electrode film, such as a PVD process, a CVD process, an electroplating process, or a chemical plating process, etc.

The first gate electrode film and the first work function film may be planarized by a CMP process, or a mask-less anisotropic dry etching process, etc. In one embodiment, a CMP process is used to planarize the first gate electrode film and the first work function film.

In one embodiment, after forming the first work function film and before forming the first gate electrode film, a second barrier film may be formed on the first work function film; and the first gate electrode film may be formed on the second barrier film. The planarization process may also planarize the second barrier film; and a second barrier layer 272 may be formed in the first opening 241.

The second barrier layer 272 may be made of any appropriate material. In one embodiment, the second barrier layer 272 is made of TiN. The second barrier layer 272 may be used to prevent the material of the first gate electrode layer 271 from diffusing into the dielectric layer 250 and the fins 201; and may be able to stabilize the performance of the NMOS transistor.

Thus, a high-K metal gate transistor structure may be formed by the disclosed methods and processes. FIG. 10 illustrates a corresponding semiconductor structure.

As shown in FIG. 10, the high-K metal gate (HKMG) transistor structure may include a semiconductor substrate 200 having a first region 210 and a second region 220 and a plurality of fins 201 formed on the semiconductor substrate 200. The HKMG transistor structure may include a first HKMG structure formed over the fins 201 in the first region 210 and a second HKMG structure formed over the fins 201 in the second region 220. The first HKMG structure may include a gate dielectric layer 250, a cap layer 251, a first work function layer 270, a second barrier layer 272, a first gate electrode layer 271 and sidewall spacers 232. The second HKMG structure may include a gate dielectric layer 250, a cap layer 251, a first barrier layer 252, a second work function layer 260, a second gate electrode layer 261 and sidewall spacers 232. Further, the HKMG transistor structure may also include source/drain regions 231 formed in the fins 201 at the two sides of the HKMG structures; and an isolation layer 202 formed between adjacent fins 201; and a dielectric layer 240 formed on the semiconductor substrate 200, the source/drain regions 231 and the isolation layer 202. The dielectric layer 240 may cover the side surfaces of the HKMG structures. The detailed structures and intermediate structures are described above with respect to the fabrication processes.

Thus, according to the disclosed processes and structures, after forming the gate dielectric layer on the side and bottom surfaces of the first opening and the second opening, a sacrificial layer may be formed in the first opening. Thus, the second work function layer and the second gate electrode layer may not be filled in the first opening. Accordingly, the process for removing the second work function layer in the first opening may be omitted; and the damages to the dielectric layer in the first opening and the residual contaminations on the inner surfaces of the first opening caused by the process for removing the second work function layer in the first opening may be avoided.

Further, because the first work function layer may be formed after forming the second gate electrode layer, the first work function layer may not be formed in the second opening; the second gate electrode layer may be easy to fill in the second opening. Thus, the quality of the second gate electrode layer may be improved. Therefore, the mismatch between the transistor in the first region and the transistor in the second region may be avoided; and the performances of the transistor in the first region and the transistor in the second region may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, fails within the true scope of the present invention.

What is claimed is:

1. A method for fabricating a high-K metal gate transistor structure, comprising:
providing a base substrate having a first region and a second region;
forming a source/drain regions in the base substrate;
forming a dielectric layer having a first opening exposing a first surface portion of the base substrate in the first region and a second opening exposing a second surface portion of the base substrate in the second region over the base substrate;
forming a gate dielectric layer on a side surface of the first opening and the first surface portion of the base substrate in the first opening and on a side surface of the second opening and the second surface portion of the base substrate in the second opening;
forming a cap layer on the gate dielectric layer in the first opening and in the second opening;
forming a first barrier layer directly on the cap layer in the first opening and in the second opening;
performing a thermal annealing process on the source/drain regions after forming the cap layer;
filling a sacrificial layer in the first opening on the first barrier layer after performing the thermal annealing process on the source/drain region;
forming a second work function layer in the second opening and a second gate electrode layer on the second work function layer, wherein the second work function layer and the second gate electrode layer are formed by:
forming a second work function film on the first barrier layer;
forming a second gate electrode film on the second work function film filling the second opening;
performing a first planarization process on the second gate electrode film and the second work function film using the first barrier layer as a stop layer; and
after performing the first planarization process, performing a second planarization process on the first barrier layer, the cap layer, and the gate dielectric layer to expose a top surface of the dielectric layer;
removing the sacrificial layer;
forming a first work function layer in the first opening and a second barrier layer in the first opening on the first work function layer; and
forming a first gate electrode layer on the second barrier layer.

2. The method according to claim 1, wherein the base substrate comprises:
a semiconductor substrate having a surface;
a plurality of fins formed on the surface of the semiconductor substrate in the first region and the second region; and
an isolation layer covering side surfaces of the fins and with a top surface lower than top surfaces of the fins.

3. The method according to claim 2, wherein:
the first opening crosses over the fins in the first region and exposes side and top surfaces of portions of the fins in the first region; and
the second opening crosses over the fins in the second region and exposes side and top surfaces of portions of the fins in the second region.

4. The method according to claim 3, wherein:
the gate dielectric layer is formed on the side and top surfaces of the fins exposed by the first opening and the second opening.

5. The method according to claim 1,
the cap layer is made of TiN on a surface of the dielectric layer.

6. The method according to claim 1, wherein:
the sacrificial layer is made of one of a back anti-reflective material, a deep UV light absorption material, and an organic dielectric material.

7. The method according to claim 1, wherein:
the second barrier layer is made of TiN.

8. The method according to claim 1, wherein the first opening and the second opening are formed by:
forming dummy gate structures having a dummy gate electrode layer on the base substrate in the first region and the second region, respectively;
forming the dielectric layer having a surface level with a top surface of the dummy gate electrode layer; and
removing the dummy gate electrode layer to form the first opening in the dielectric layer in the first region and the second opening in the dielectric layer in the second region.

9. The method according to claim 8, wherein:
the source/drain regions in the base substrate are formed at the two sides of the gate dummy gate structures.

10. A high-K metal gate (HKMG) transistor structure, comprising:
a semiconductor substrate having a first region and a second region;
a plurality of fins formed on the semiconductor substrate in the first region and the second region;
a first HKMG structure formed over the fins in the first region, the first HKMG structure including a gate dielectric layer, a first work function layer, and a first gate electrode layer;
a second HKMG structure formed over the fins in the second region, the second HKMG structure includes a gate dielectric layer, a second work function layer, and a second gate electrode layer, wherein
a first opening is formed exposing a portion of a surface of the semiconductor substrate and the fins in the first region and a second opening is formed exposing a portion of the surface of the semiconductor substrate and the fins in the second region,
a gate dielectric layer is formed on a side surface of the first opening and the exposed surfaces of the semiconductor substrate and the fins in the first opening and on a side surface of the second opening and the exposed surfaces of the semiconductor substrate and the fins in the second opening,
a cap layer is formed on the gate dielectric layer and a thermal annealing process is performed on the source/drain regions through the cap layer, wherein the thermal annealing process is performed on the source/drain regions after forming the cap layer,
a first barrier layer is formed directly on the cap layer in the first opening and in the second opening,
the second work function layer is formed in the second opening and the second gate electrode layer formed on the second work function layer, wherein a sacrificial layer is formed in the first opening before forming the second work function layer and the sacrificial layer is removed after the second work function layer is formed, wherein the second work function layer and the second gate electrode layer are formed by:

forming a second work function film on the first barrier layer;

forming a second gate electrode film on the second work function film filling the second opening;

performing a first planarization process on the second gate electrode film and the second work function film using the first barrier layer as a stop layer; and after performing the first planarization process, performing a second planarization process on the first barrier layer, the cap layer, and the gate dielectric layer to expose a top surface of the dielectric layer, the first work function layer is formed in the first opening and a second barrier layer in the first opening on the first work function layer, and the first gate electrode layer is formed on the second barrier layer;

source/drain regions formed in the fins at the two sides of the HKMG structures;

an isolation layer formed between adjacent fins; and a dielectric layer covering side surfaces of the HKMG structures formed on the semiconductor substrate, the source/drain regions and the isolation layer.

11. The high-K metal gate transistor structure according to claim 10, wherein:

the first region is an NMOS regions;

the second region is a PMOS region;

the first work function layer is made of TiAlC;

the second work function layer is made of TiN;

the first gate electrode layer is made of one of TiAl and W; and the second gate electrode layer is made of W.

12. The high-K metal gate transistor structure according to claim 10, wherein the cap layer formed on the gate dielectric layer comprises TiN.

* * * * *